US005591939A

United States Patent [19]

Hoffmann et al.

[11] Patent Number: 5,591,939

[45] Date of Patent: Jan. 7, 1997

[54] ENCLOSURE HOOD

[75] Inventors: Wolfgang Hoffmann; André Koerner, both of Lippstadt; Maik Zimmer, Erwitte, all of Germany

[73] Assignee: Hella KG Hueck & Co., Lippstadt, Germany

[21] Appl. No.: 229,335

[22] Filed: Apr. 12, 1994

[30] Foreign Application Priority Data

Apr. 23, 1993 [DE] Germany .......................... 43 13 285.5

[51] Int. Cl.$^{6}$ .......................... H05K 5/03; H01R 13/447

[52] U.S. Cl. .......................................... 174/67; 174/138 F

[58] Field of Search ............................ 174/66, 67, 138 F; 439/148, 149, 842, 844

[56] References Cited

U.S. PATENT DOCUMENTS

| | | |
|---|---|---|
| 794,140 | 7/1905 | Costa . |
| 3,137,535 | 6/1964 | Collier et al. .............................. 439/61 |
| 5,045,640 | 9/1991 | Riceman .................................. 174/67 |
| 5,242,311 | 9/1993 | Seong ..................................... 439/135 |
| 5,285,014 | 2/1994 | Gilchrist ................................... 174/67 |
| 5,480,312 | 1/1996 | Watanabe et al. ....................... 439/135 |

FOREIGN PATENT DOCUMENTS

| | | |
|---|---|---|
| 8912130.9 | 1/1990 | Germany . |

*Primary Examiner*—Kristine L. Kincaid
*Assistant Examiner*—Dean A. Reichard
*Attorney, Agent, or Firm*—Griffin, Butler, Whisenhunt & Kurtossy

[57] ABSTRACT

A substantially rectangularly shaped enclosure hood has, in an area of an upper covering plate differently shaped grooves formed therein. These grooves serve as an aid in orientation during mounting as well as an extraction aid for a finished, assembled device.

10 Claims, 2 Drawing Sheets

ENCLOSURE HOOD

BACKGROUND OF THE INVENTION

This invention concerns an enclosure hood for electric, electronic or electromagnetic devices having a cavity accessible through an open side thereof but being closed by a covering plate at a side thereof opposite the open side.

Such casing hoods are often rectangularly-shaped and serve as coverings for, for instance, relay casings. Thus, in german Gebrauchsmuster DE-GM 89 12 130 a casing is disclosed with a pot-shaped enclosure hood, whose edge has a step-shaped recess. This step-shaped recess serves to engage a peripheral depressed area of a base plate, with the base plate being sealed to the pot-shaped enclosure hood to be water proof, in an especially beneficial way.

Furthermore enclosure, or casing, hoods are known, which have bores or pocket bores, on two sides thereof, in which suitable tool parts can engage for manipulating the enclosure hoods. Thus, for example, when an electric, electronic or electromagnetic device is mounted, parts of an automatic supply apparatus can engage in the openings or indentations of the enclosure hood and bring the enclosure hood to a position suitable for mounting it on an appropriate enclosure sub-member.

Such an enclosure hood has several disadvantages:

On the one hand the automatic supply apparatus cannot recognize the exact orientation of the casing, since the enclosure hood appears the same to the automatic supply apparatus upon a 180 degree turn thereof about an imaginary vertical axis extending through the middle of the open side.

To guarantee a faultless mounting, therefore, the interior of the enclosure hood must be either completely empty or it must have no structure which cooperates with components mounted on the sub-member (base plate) of the casing, or attachments mounted in the interior of the enclosure hood must be formed symmetrical to the above described axis.

Many enclosure hoods have in their interiors asymmetrical shapes, for example for mechanically supporting device parts mounted in the hoods undersides. With such enclosure hoods the danger exists of faulty mountings because of failure to recognize orientation.

On the other hand, several electric devices are often arranged side by side, for instance electric relays on a circuit board with relay sockets thereon. When this is the case it is detrimental, that device housings, or hoods, shaped in the known way, are not, individually, easily accessible.

Especially then, for instance when relay housings are densely arranged in two directions as often occurs in motor vehicles because of space considerations, a replacement of a relay, particularly one arranged in the middle of the relay group, can be very difficult or even impossible, since gripping points of the enclosure hoods are concealed by adjacent relays and the enclosure hoods, therefore cannot be gripped by a tool.

It is thus an object of this invention, to provide an enclosure hood, which is especially easy to manipulate, and which particularly makes possible an automatic orientation in a simple and cost effective manner.

SUMMARY

According to principles of this invention a covering plate defines enclosure-hood grooves in areas of two end portions thereof, which grooves are differently shaped.

BRIEF DESCRIPTION OF THE DRAWINGS

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF PREFERRED EMBODIMENTS

Figure 1:
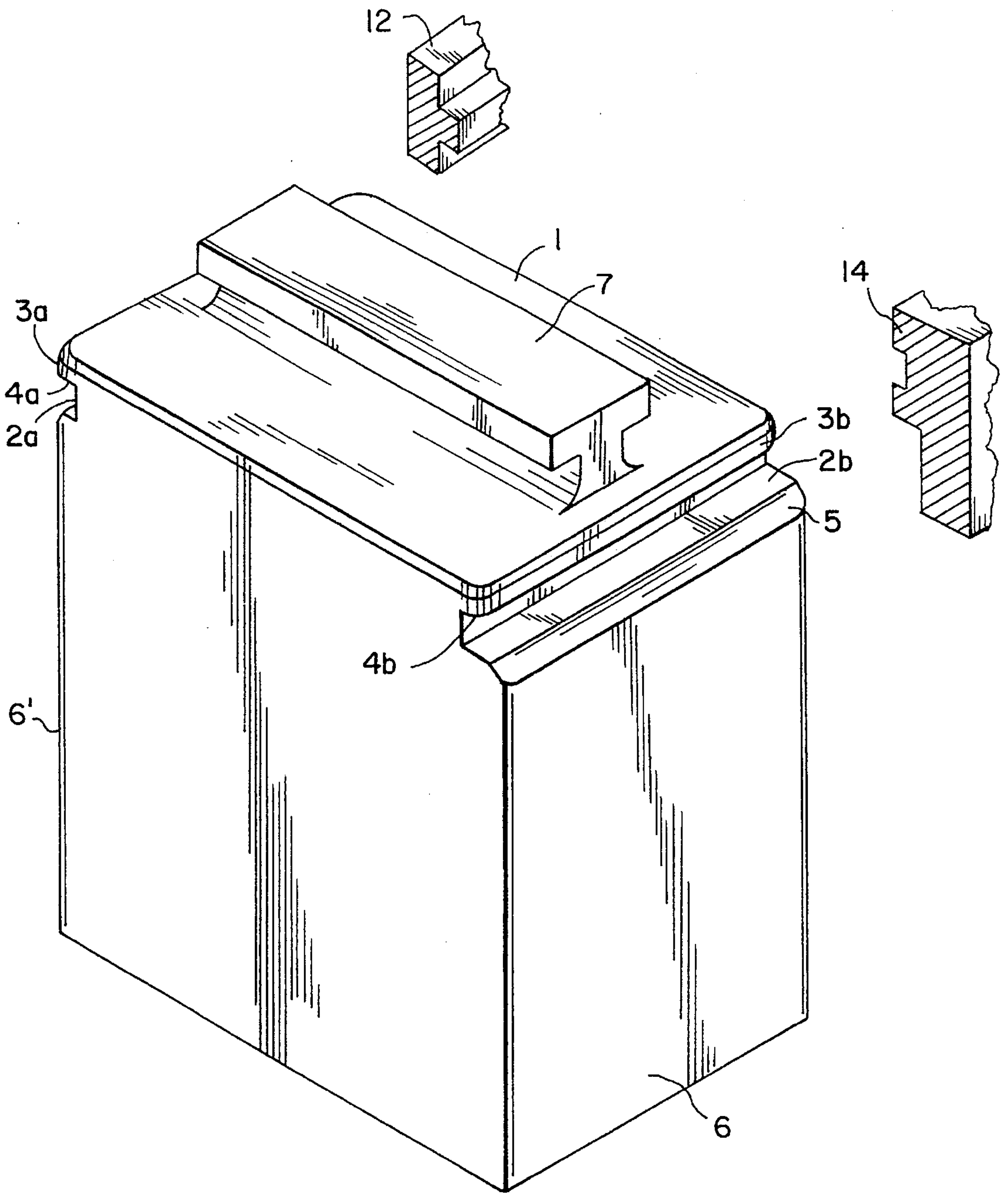
FIG. 1 is an isometric view of an enclosure hood of this invention.

Using the drawings, two possible examples of the enclosure hood of this invention are described as follows:

FIG. 1 shows an enclosure hood of this invention, which can be used, for instance, with a relay casing. It essentially comprises a rectangularly-shaped plastic housing.

The underside, which is not visible in FIG. 1, is open to allow access to a hood interior which is essentially a hollow cavity.

The side positioned opposite the open side of the enclosure hood is closed by a covering plate 1. Along a periphery, or border, below the covering plate 1, grooves 2*a*, 2*b* are formed along two opposite edges, with respective end portions 4*a*, 4*b* of the covering plate 1 forming upper legs 3*a*, 3*b* defining the respective grooves 2*a*, 2*b*.

At the first groove 2*a* both legs 4*a* defining the groove are the same length so that at this groove a facing edge 3*a* of the covering plate 1 is flush with, or approximately in the same plane with, an enclosure hood outer surface 6' parallel thereto.

At the second groove 2*b* the groove leg 4*b* formed by the covering plate 1 is shorter than a second leg defining the same groove 2*b*, so that a facing edge 3*b* of the covering plate 1, lying parallel to this groove 2*b*, is not flush, or in the same plane with, the corresponding enclosure hood outer surface 6.

The enclosure hood has, thus, in the area of the covering plate 1, two differently shaped grooves 2*a*, 2*b*.

At a mouth of each groove 2*a*, 2*b* there is, additionally, a chamfer 5 formed, with only the chamfer of the groove 2*b* being visible in FIG. 1.

A mounting of an electric, electronic or electromagnetic device which has an enclosure hood of this invention thereon is described below in more detail, using FIG. 1.

When such a device is mounted, the open underside of the enclosure hood is placed on a base plate (not shown in FIG. 1), which component supports the electric, electronic or electromagnetic device, and is adhered thereto or interengaged therewith.

Frequently it is thereby required that the enclosure hood has, after its mounting, a particular orientation relatively to the base plate. This orientation is important, particularly if elements 10 formed on the interior of the enclosure hood engage or insert into the device mounted on the base plate with the thusly formed elements being arranged asymmetrical relative to an imaginary, vertical, axis, at the middle of the open side. Or it may be required that an inscription on the enclosure hood have a predetermined orientation, for instance relative to an arrangement of contact-terminals extending through the base plate.

During mounting of most such device housings, or hoods, the enclosure hoods are fed to a mounting device, for example by an oscillating conveyor, which puts the enclosure hoods on the device base plate.

When this is done, the orientation of the arriving enclosure hoods can be predetermined by a suitable arrangement of baffle plates along the conveyor path. For usual prior art rectangularly shaped enclosure hoods, however, because of their symmetrical construction a first orientation cannot be thereby distinguished from a second orientation if the two orientations differ solely by a 180° rotation about the vertical axis extending perpendicular to the open side.

Such a distinction is, however, possible with an enclosure hood of this invention. Because of the asymmetrical shape of the grooves an appropriate apparatus can recognize the position of the enclosure hood.

This can be carried out, for example, by the enclosure-hood-transporting oscillating conveyor feeding the enclosure hoods to an apparatus having two blades 12, 14, which grip into the two grooves upon a properly oriented conveyance but which, upon an improperly oriented conveyance, in cooperation with appropriately arranged baffle plates, either ejects the received enclosure hood, or effects a rotation thereof.

The enclosure hood is thus, by the apparatus of this invention, always correctly positioned when it is fed to the mounting device.

A further advantage of the enclosure hood of this invention emerges when several devices using the enclosure hood are densely arranged, side by side. A multitude of relays for a motor vehicle, for example, are often arranged on a relay support plate. When this is the case, the relays are inserted in lines and columns in relay sockets. In order to arrange the relays as space-economically as possible, they are set with no, or only with slight, intervals therebetween.

Because of this the disadvantage arises that an individual relay, particularly if it sits in the middle of such an arrangement, can only be removed with much difficulty from its socket, since it lacks a suitable handle with which one can grab the relay casing.

For relays with enclosure hoods of this invention a space is developed in the vicinity of each groove, if the relays are placed next to one another with the same orientation, because of the offset, or displacement, between the facing edge 3*b* and the side surface 6, which provides help for extraction with a suitable, preferably pliers-like, tool which finds entrance into the groove 2*a*, 2*b*.

In this way it is easily possible to pull an individual device from a device group.

Figure 2:
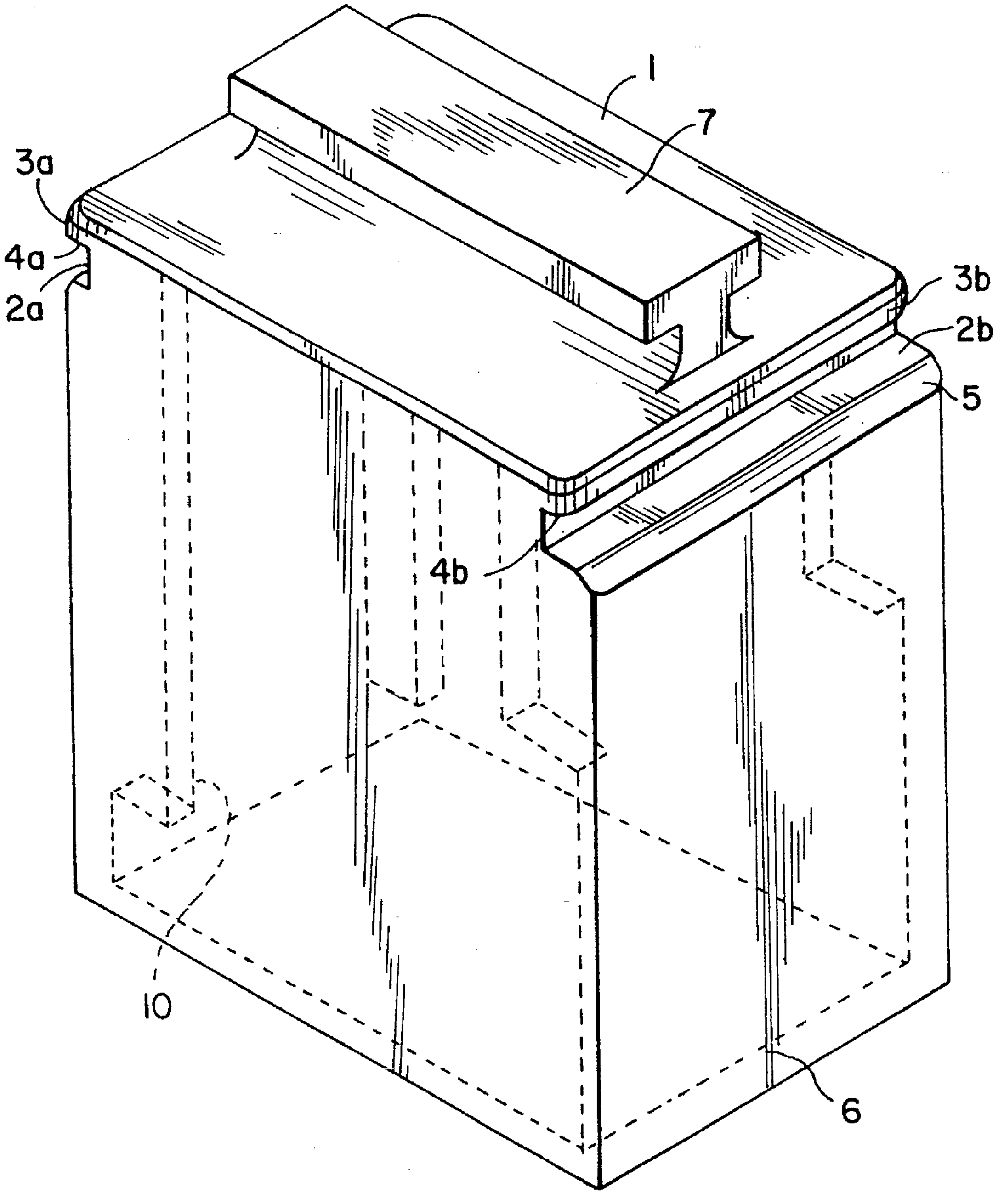
FIG. 2 is an isometric view of another-embodiment enclosure hood of this invention.

If a similar orientation of all enclosure hoods of a device group is not possible or intended, the inventive enclosure hood can also be like the embodiment of FIG. 2.

The enclosure hood of FIG. 2 corresponds to the one shown in FIG. 1, but a handle-shaped member is formed on the covering plate 1, which can be, for instance, T-shaped (as shown) or ring-shaped and in which an extraction tool can inter-engage for extraction. In this manner, this embodiment of the enclosure hood of this invention is even easier to manipulate.

In contrast, the simpler structure of the figure 1 embodiment distinguishes itself by having a lower profile.

Because of the differently shaped grooves the orientation of the enclosure hood thus becomes clearly recognizable during mounting, for instance by an automatic supply apparatus. Thus, faulty mounting because of a faulty orientation of the enclosure hood can be avoided.

It is especially beneficial that the legs formed by the end portions of the covering plate are of different lengths such that, for example, one facing edge of the covering plate lies flush with, or in the same plane with, an outer side surface of the housing hood and that the second groove leg formed by the other end portion of the covering plate is shorter than the first groove leg.

Because of this, intermediate spaces are created between the housing hoods in the areas of the grooves for an aggregation of a plurality of device housing hoods placed next to one another with which the housing hoods can be gripped by a tool. Because of this, it is easily possible to replace individual devices from a device group.

It is also beneficial that both grooves lie parallel to one another because blade-like or pliers-shaped tools for manipulating the enclosure hoods can be easily constructed.

In this connection, it has likewise proven to be beneficial to form on the enclosure hood in the area of each of the grooves a chamfer so that tool parts can more easily grip into the grooves.

The embodiments of the invention in which an exclusive property or privilege are claimed or defined as follows:

1. Enclosure hood for an electrical, electronic or electromagnetic device, defining a cavity, accessible through an open side thereof and closed at a side thereof opposite the open side by a covering plate, wherein in areas of two end portions at opposite ends of the covering plate the enclosure hood defines grooves which have different shapes.

2. Enclosure hood as in claim 1 wherein the two end portions of the covering plate respectively form end-portion groove legs at the opposite ends of the covering plate for defining the grooves.

3. Enclosure hood as in claim 2 wherein the end-portion groove legs have lengths which differ from one another.

4. Enclosure hood as in claim 3 wherein a facing edge of only one of the end-portion groove legs, at a first opposite end of the covering plate, is flush with a parallel outer surface of a part of the enclosure hood forming an adjacent groove leg.

5. Enclosure hood as in claim 1 wherein the enclosure hood has integral members in its interior which are asymmetrically arranged relative to an imaginary axis extending perpendicular to the covering plate in a central region of the open side.

6. Enclosure hood as in claim 1 wherein chamfers are formed along the grooves on the enclosure hood.

7. Enclosure hood as in claim 1 wherein during mounting thereof a part of an automatic supply apparatus engages in at least one of said grooves.

8. Enclosure hood as in claim 7 wherein the automatic supply apparatus uses the different shapes of the grooves to recognize an orientation of the enclosure hood.

9. Enclosure hood as in claim 1 wherein the covering plate has a handle-shaped integral member formed on an exterior surface thereof.

10. Enclosure hood as in claim 4 wherein a facing edge of said end-portion groove leg at a second opposite end of the covering plate is spaced inwardly from a parallel outer surface of part of the enclosure hood forming an adjacent groove leg.

* * * * *